United States Patent
Peng et al.

(10) Patent No.: US 10,560,097 B1
(45) Date of Patent: Feb. 11, 2020

(54) HIGH-SPEED 4:1 MULTIPLEXER FOR VOLTAGE-MODE TRANSMITTER WITH AUTOMATIC PHASE ALIGNMENT TECHNIQUE

(71) Applicants: Chu-Yun Peng, Taoyuan (TW); Chia-Hao Shih, Taipei (TW)

(72) Inventors: Chu-Yun Peng, Taoyuan (TW); Chia-Hao Shih, Taipei (TW)

(73) Assignee: Teletrx Co., Taipei (TW)

( * ) Notice: Subject to any disclaimer, the term of this patent is extended or adjusted under 35 U.S.C. 154(b) by 0 days.

(21) Appl. No.: 16/147,477

(22) Filed: Sep. 28, 2018

(51) Int. Cl.
  *H03K 19/0185* (2006.01)
  *H03K 19/173* (2006.01)
  *H04L 7/033* (2006.01)
  *H03L 7/081* (2006.01)

(52) U.S. Cl.
  CPC ............. *H03K 19/01855* (2013.01); *H03K 19/018521* (2013.01); *H03K 19/018571* (2013.01); *H03K 19/1737* (2013.01); *H03L 7/0814* (2013.01); *H04L 7/033* (2013.01)

(58) Field of Classification Search
  CPC ..... H03K 19/018521; H03K 19/01855; H03K 19/018571; H03K 19/1737; H03H 17/0657; H03L 7/081; H03L 7/0814; H04L 7/033; H04L 7/0334

USPC ....... 375/226, 327, 254, 355, 371, 373, 375, 375/376; 708/250, 253, 256, 313
  See application file for complete search history.

(56) References Cited

U.S. PATENT DOCUMENTS

| | | | |
|---|---|---|---|
| 2014/0112356 A1* | 4/2014 | Cheng | H04L 7/0331 370/517 |
| 2014/0269117 A1* | 9/2014 | Maryan | G11C 7/1087 365/193 |
| 2015/0104196 A1* | 4/2015 | Bae | H04B 10/58 398/193 |
| 2019/0212769 A1* | 7/2019 | Carlough | G06F 1/08 |

* cited by examiner

*Primary Examiner* — Young T Tse
(74) *Attorney, Agent, or Firm* — Chih Feng Yeh; Huntington IP Consulting Co., Ltd.

(57) ABSTRACT

A multiphase serialization system for a voltage-mode transmitter includes a N-to-one stage driven by a N-phase input clock, a phase alignment unit driven by the N-phase input clock being operated to generated interpolated sampling clock signals by adjusting a plurality of reference clock signals provided to the phase alignment unit based on the N-phase input clock, and a preceding multiplexing stage driven by the interpolated sampling clock signals configured to receive incoming data streams and to output phase aligned data streams to the N-to-one stage.

20 Claims, 9 Drawing Sheets

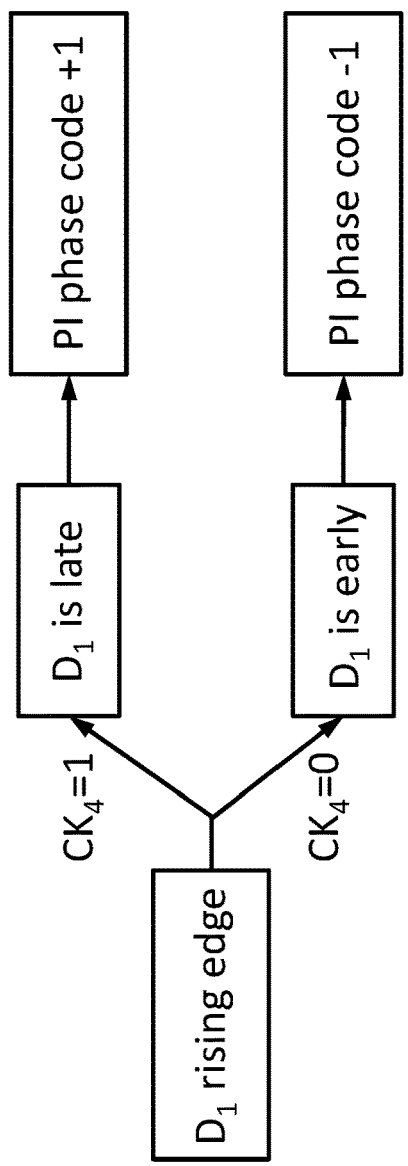
FIG. 5C
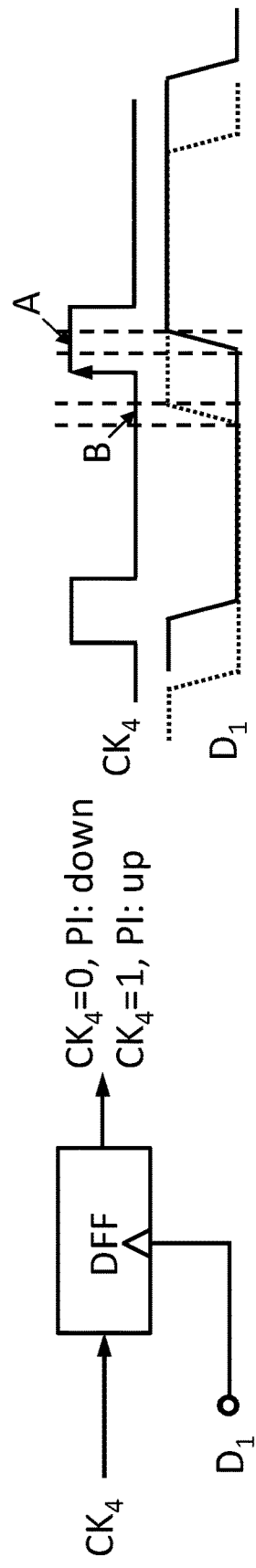
FIG. 5E
FIG. 5D

HIGH-SPEED 4:1 MULTIPLEXER FOR VOLTAGE-MODE TRANSMITTER WITH AUTOMATIC PHASE ALIGNMENT TECHNIQUE

BACKGROUND

Technical Field

The present invention relates to a multiplexer, and more particularly, a high-speed 4:1 multiplexer for voltage-mode transmitter with automatic phase alignment technique.

Related Arts

The continuously increasing bandwidth for data communication has pushed wire-line connection towards data-rates of 50 Gb/s or beyond. A 400 Gb/s standard has approved by IEEE to quadruple the backbone bandwidth of the existing 100 Gb/s Ethernet. Meanwhile, high-speed connections for storage networks also boost a rapid growth. As one of the most important components in these serial links, the transmitter needs to produce precise timing information for correct data transmission and provide appropriate compensating abilities to cancel the channel dispersion. In further, the timing budget and high-efficiency requirements make the design task even more challenging. The challenges in the transmitter around 50 Gb/s or more mainly concentrate on the final-stage serialization and multi-tap equalization.

Serialization is commonly achieved by using a multiplexing tree that consist of 2:1 multiplexer (MUX). For the last few stages, current-mode logic (CML) is commonly used to meet the speed requirement, which consumes static current and can considerably increase the overall power consumption. In further, at the last 2:1 MUX stage, due to short bit time, it can be challenging to meet the setup and hold time constraints of the MUX across process-voltage-temperature (PVT) variations. As revealed in the literature, replacing the last two stages of 2:1 MUXs with a 4:1 MUX eliminates several MUXs and latches and reduces power. This arrangement also relaxes timing constraints due to longer clock periods so that no additional phase calibration loop is required. However, a challenge occurs for incorporating equalization such as feed-forward equalizer (FFE) into the transmitter structure to compensate for channel loss at such high frequencies. As the data rate exceeds 40 Gb/s, the design of the FFE is more difficult. Many designs replicate the multiplexing tree for each delayed signal which requires high-speed MUXs operating at full rate. Even though recent research indicates that running a single MUX at 60 Gb/s is possible, the power consumption increases linearly with the number of taps and can become impractical.

In order to achieve bit times on the order of a gate delay, a transmitter design is proposed which introduces a multiplexing tree with a high-speed final multiplexing stage. This stage uses multiphase sampling with automatic alignment technique.

SUMMARY

In this invention, a high-speed 4:1 multiplexer for voltage-mode transmitter with automatic phase alignment technique is proposed.

A multiphase serialization system for a voltage-mode transmitter includes a N-to-one stage driven by a N-phase input clock, a phase alignment unit driven by the N-phase input clock being operated to generate interpolated sampling clock signals by adjusting a plurality of reference clock signals provided to the phase alignment unit based on the N-phase input clock, and a preceding multiplexing stage driven by the interpolated sampling clock signals configured to receive incoming data streams and to output phase aligned data streams to the N-to-one stage. The output phase-aligned data streams is aligned with a rising edge of one of the N-phase input clock.

According to one aspect of the invention, the preceding multiplexing stage is composed of a plurality of sub-preceding multiplexing stages, each sub-preceding multiplexing stage being driven by the interpolated sampling clock signals is configured to receive the incoming data streams and to output phase aligned data streams to the N-to-one stage.

According to one aspect of the invention, the phase alignment unit further includes a first phase interpolator, a second phase interpolator coupled to the first interpolator, the first phase interpolator configured to receive the reference clock signals from the N-phase input clock to generate a first interpolated clock signal for driving a portion of the sub-preceding multiplexing stages, and the second phase interpolator configured to receive the reference clock signals from the N-phase input clock to generate a second interpolated clock signals for driving the remaining portion of the sub-preceding multiplexing stages.

According to one aspect of the invention, the first interpolated clock signal is a zero-degree clock signal.

According to another aspect of the invention, the second interpolated clock signal is a 90-degree clock signal.

According to another aspect of the invention, the N-to-one stage having N slices and each slice comprises a first supply source, a first transistor, a second transistor, and a second supply source serially connected to provide a current path, a NAND gate coupled to a gate of the first transistor, a NOR gate coupled to a gate of the second transistor.

According to another aspect of the invention, the first transistor is a PMOS transistor.

According to another aspect of the invention, the second transistor is a NMOS transistor.

A method of multiphase serialization for a voltage-mode transmitter includes providing a N-to-one stage driven by a N-phase input clock, providing a phase alignment unit driven by the N-phase input clock for generating interpolated sampling clock signals by adjusting a plurality of reference clock signals provided to the phase alignment unit based on the N-phase clock, and providing a preceding multiplexing stage driven by the interpolated sampling clock signals for receiving incoming data streams and outputting phase aligned data streams to the N-to-one stage. The output phase-aligned data streams is aligned with a rising edge of one of the N-phase input clock.

BRIEF DESCRIPTION OF THE DRAWINGS

The components, characteristics and advantages of the present invention may be understood by the detailed descriptions of the preferred embodiments outlined in the specification and the drawings attached:

FIG. 5C illustrates a block diagram showing a method for the alignment calibration by a finite state machine, according to one embodiment of the present invention;

FIG. 5D illustrates exemplary circuit for the alignment calibration by a finite state machine, according to one embodiment of the present invention;

FIG. 5E illustrates a schematic chart showing waveform generated by the exemplary circuit in FIG. 5D for the alignment calibration, according to one embodiment of the present invention;

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

Figures 1A, 1B:
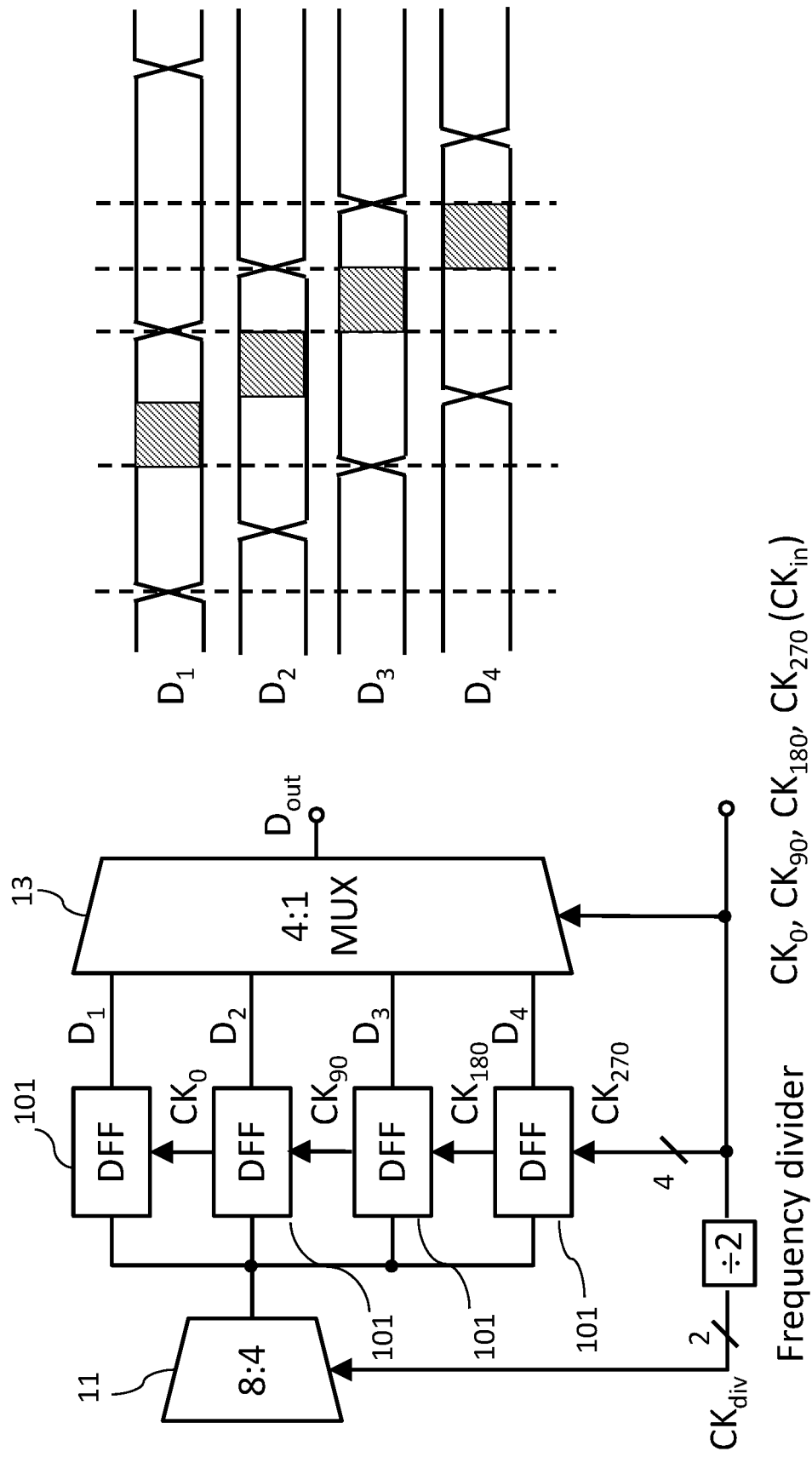
FIG. 1A illustrates multiphase sampling for a conventional CMOS 4:1 MUX according a prior art.
FIG. 1B illustrates an exemplary timing diagram showing the operation of FIG. 1A, according a prior art.

FIG. 1A illustrates the minimum number of latches needed for a conventional CMOS 4:1 MUX if the divided clock is differential. In this case, the four outputs of the preceding 8:4 stage 11, each of them coupled to a D-type flip-flop 101 and to the 4:1 MUX 13. Signals $D_1$, $D_2$, $D_3$ and $D_4$ represents digital input signals from the output of the D-type flip-flops 101 located between the preceding 8:4 stage 11 and the 4:1 MUX 13, while signals $CK_0$, $CK_{90}$, $CK_{180}$ and $CK_{270}$ represents input four-phase clock signals $CK_{in}$ generated from a phase-locked loop (not shown). The input four-phase clock signals ($CK_0$, $CK_{90}$, $CK_{180}$ and $CK_{270}$) directly drive the 4:1 MUX 13 and the frequency divider. The output of frequency divider $CK_{div}$ drives the proceeding 8:4 stage 11. Outputs of the 8:4 stage 11 can be triggered by $CK_{div}$ to generate output aligned data signals. These aligned data signals are then fed into four D-flip-flops to be sampled by the clock signals $CK_{in}$ and retimed before being applied to the 4:1 stage using four D-flip-flops 101 to provide sufficient serialization timing for the 4:1 MUX 13. Since a D-type flip-flop is equivalent to two latches connected in series, there are eight latches in the structure.

FIG. 1B illustrates an exemplary timing diagram showing the operation of FIG. 1A, according a prior art. The parallel data streams from output of the 8:4 stage 11 are processed by the latches of the D-type flip-flop to generate the unit interval-(UI) spaced data streams of $D_1$, $D_2$, $D_3$ and $D_4$, respectively. These prepared UI-spaced data are then sequentially selected by the 25% duty cycle clocks of $CK_1$, $CK_2$, $CK_3$ and $CK_4$ that generated inside the 4:1 MUX to form the serial sequence. In one of the preferred embodiments, individual of the 25% duty cycle clocks of $CK_1$, $CK_2$, $CK_3$ and $CK_4$ can be generated by ANDing two adjacent clock phases of the input four-phase clock signals ($CK_0$, $CK_{90}$, $CK_{180}$ and $CK_{270}$). Each of the shaded areas represents a timing window for passing each of the output data.

Figure 2:
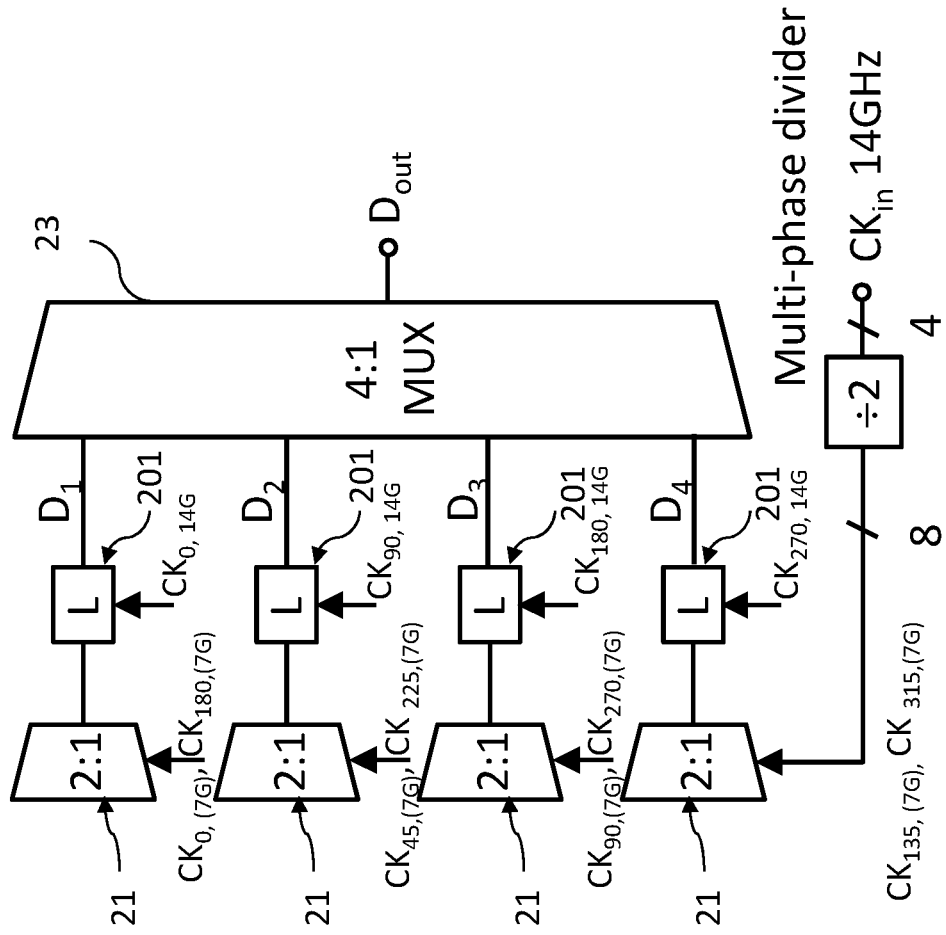
FIG. 2 illustrates multiphase sampling for another conventional CMOS 4:1 MUX according to a prior art.

If the divided clock has eight phases, i.e., $CK_{0,\ (7G)}$, $CK_{180,\ (7G)}$, $CK_{45,\ (7G)}$, $CK_{225,\ (7G)}$, $CK_{90,\ (7G)}$, $CK_{270,\ (7G)}$, $CK_{135,\ (7G)}$, as shown in FIG. 2, it maintains the same time resolution of the input clock. Signals $D_1$, $D_2$, $D_3$ and $D_4$ represents digital input signals from the output of the latches 201 located between the preceding 8:4 stage 21 and the 4:1 MUX 23. Outputs of the preceding multiplexing stage 21 will be retimed already and the number of latches 201 required before the 4:1 MUX 23 is only four. This 50% reduction in the number of latches causes significant power saving due to the reduced power of the latches themselves and the reduced clock loading. For very high speeds, if these latches need inductive peaking, multiphase sampling also leads to significant area saving due to the reduced number of inductors.

For this argument to be valid for high-speed MUX application, the design of the frequency divider must follow the guide line that these extra phase are not generated at an excessive cost. However, larger power dissipation still happens on the multiphase divider even though the number of latches has been reduced from eight to four.

Figure 3A:
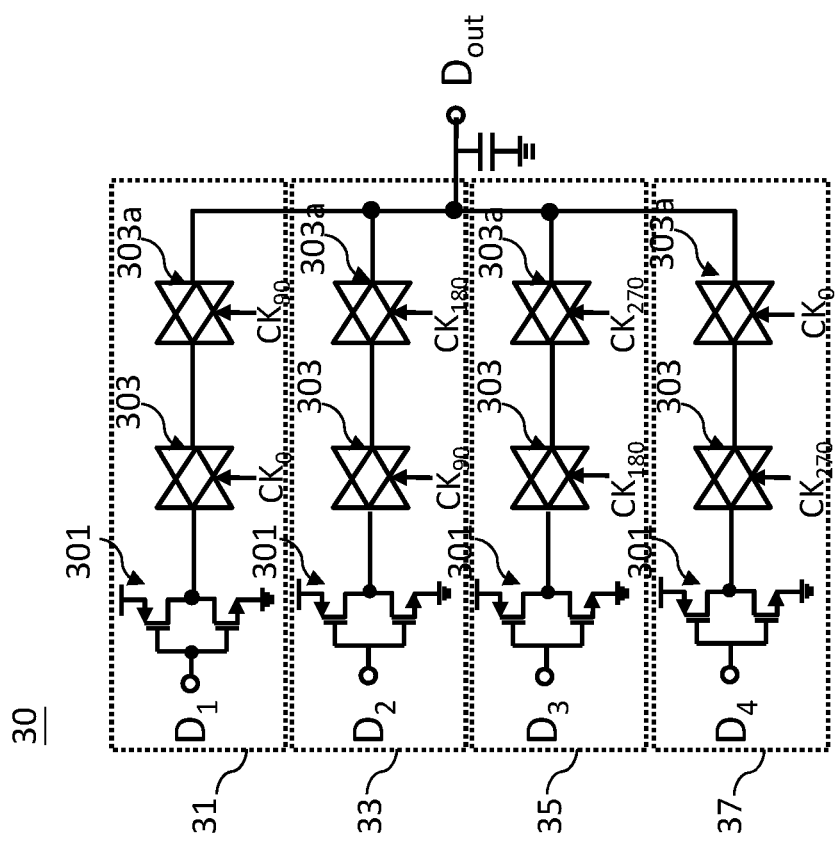
FIG. 3A illustrates a conventional CMOS 4:1 MUX implementation for the time multiplexing of the input data according to a prior art.
Figure 3B:
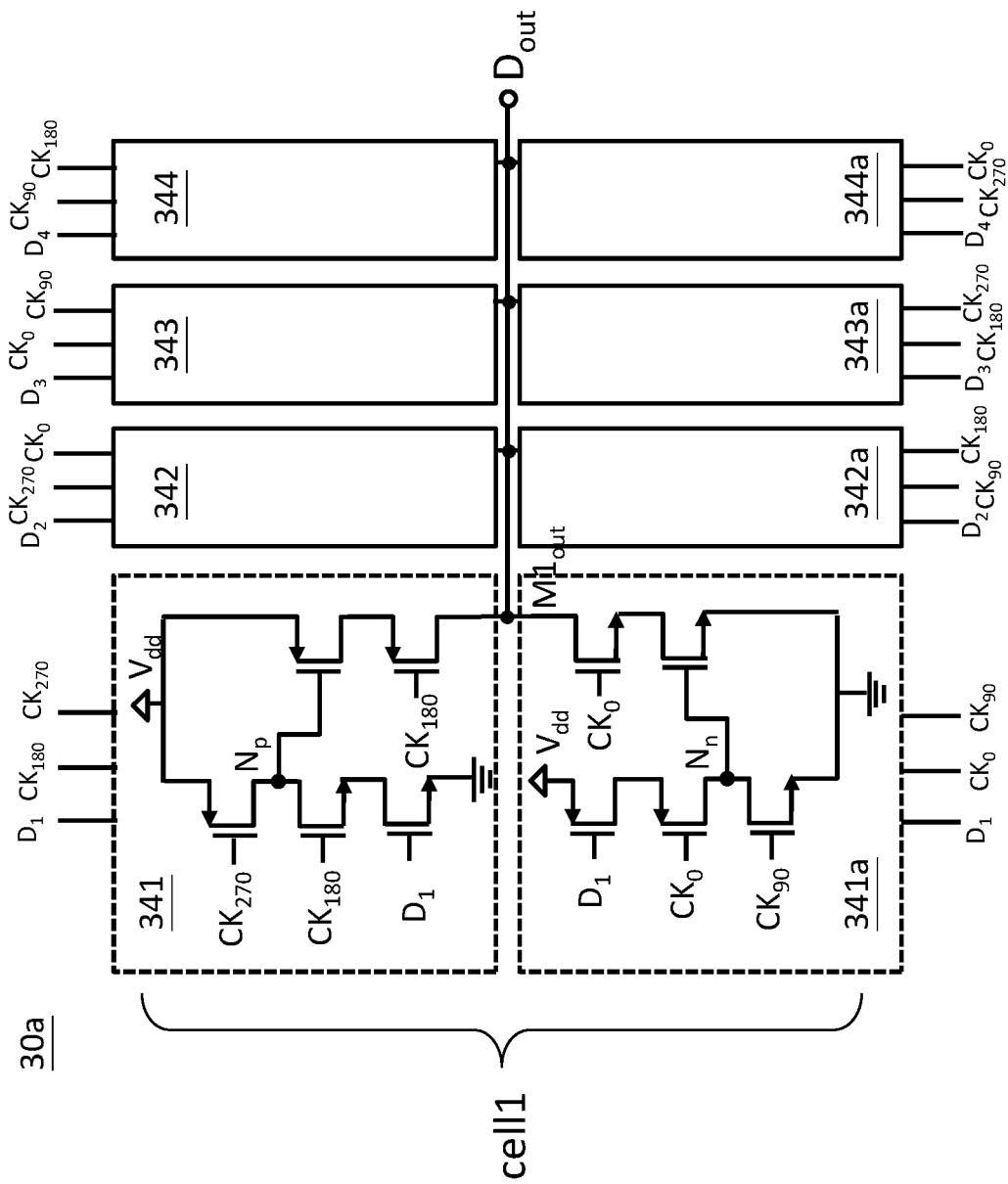
FIG. 3B illustrates another conventional CMOS 4:1 MUX implementation for the time multiplexing of the input data according to a prior art.

In addition to the previous mentioned multiphase sampling for a conventional CMOS 4:1 MUX, conventional CMOS 4:1 MUX implementations in the MUX core is described in FIG. 3A-B. In one embodiment of a prior art, FIG. 3A illustrates a conventional CMOS 4:1 MUX implementation 30 for the time multiplexing of the input data, each segment (31, 33, 35 or 37) can be designed using an inverter 301 in series with two transmission gate 303 and 303a, i.e. ($CK_0$, $CK_{90}$) for segment 31, ($CK_{90}$, $CK_{180}$) for segment 33, ($CK_{180}$, $CK_{270}$) for segment 35, and ($CK_{270}$, $CK_0$) for segment 37. In order to make a 25% duty-cycle pulse, both transmission gates 303 and 303a should be set to high in each segment to transmit data signals $D_1$, $D_2$, $D_3$ or $D_4$ into terminal Dour respectively. Signals $D_1$, $D_2$, $D_3$ and $D_4$ represents digital input signals from the output of the latches of the preceding stage, while signals $CK_0$, $CK_{90}$, $CK_{180}$ and $CK_{270}$ represents input clock signals.

Figure 3C:
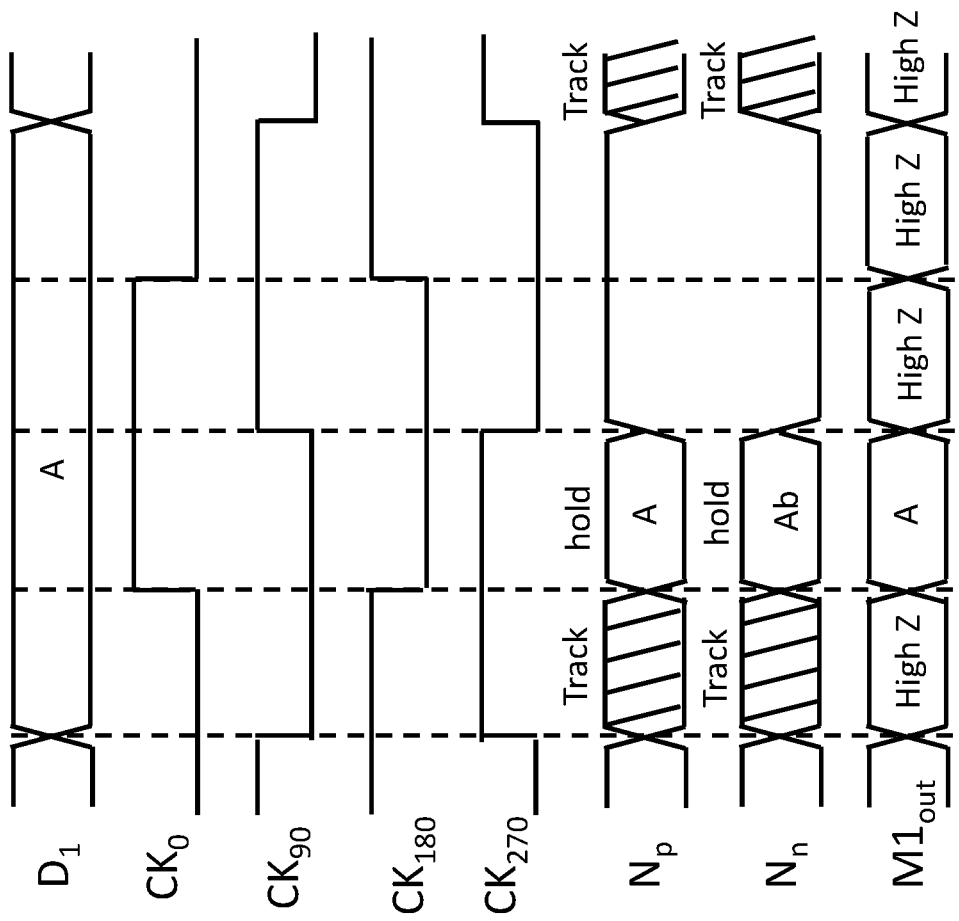
FIG. 3C illustrates the timing diagram of the first cell that described in FIG. 3B according to a prior art.

Alternatively, referring to FIG. 3B, another kind of conventional 4:1 MUX implementation 30a is illustrated, it is used to reduce the power consumption of clocking circuits. In FIG. 3B, the 4:1 MUX 30a is a 4-to-1 CMOS multiplexer (MUX), which contains four pull-up/pull-down cells 341/341a, 342/342a, 343/343a and 344/344a. Each pull-up/pull-down cell contains a plurality of PMOS switches and NMOS switches connected to form data and clock signal paths. The timing diagram of the first cell is shown in FIG. 3C. As long as $CK_{90}$ is high ($CK_{270}$ is low), the $N_p$ and $N_n$ nodes are charged to $V_{dd}$ and discharged to ground respectively. When $CK_{90}$ goes low, the $N_p$ and $N_n$ nodes will track the $D_1$ (A) and its complement (Ab) respectively. At the rising edge of $CK_0$, the input data is sampled on the parasitic capacitance on the $N_p$ and $N_n$ nodes. These nodes hold their values until $CK_{90}$ goes high. During the time window when $CK_0$ is high and $CK_{90}$ is low, the cell 1 (341/341a) output $M1_{out}$ is equal to the input data $D_1$. When $CK_0$ is low or $CK_{90}$ is high, $M1_{out}$ is disconnected from $D_{out}$. Therefore, each pull-up/pull-down cell controls the output signal during the time when its clock ($CK_0$ in cell 1) is high and its delayed clock ($CK_{90}$ in cell 1) is low. By connecting the appropriate clock phases to each of the pull-up and pull-down cells, the output is driven by one cell at a time and each clock phase sees the same capacitive load. PMOS represents p-type metal-oxide-semiconductor field effect transistor while NMOS represents n-type metal-oxide-semiconductor field effect transistor. Signals $D_1$, $D_2$, $D_3$ and $D_4$ represents digital input signals from the output of the latches of the preceding stage, while signals $CK_0$, $CK_{90}$, $CK_{180}$ and $CK_{270}$ represents input clock signals.

The conventional 4:1 MUXs mentioned earlier have some drawbacks for either having large number of latches being used or having large power consumption due to the application of multiphase divider while reducing the number of latches. To cope with these issues, a transmitter design is proposed to introduce a multiplexing tree with a high-speed final multiplexing stage. This stage uses multiphase sampling with automatic alignment technique.

In this invention, a high-speed 4:1 multiplexer for voltage-mode transmitter with automatic phase alignment technique is proposed.

Figure 4:
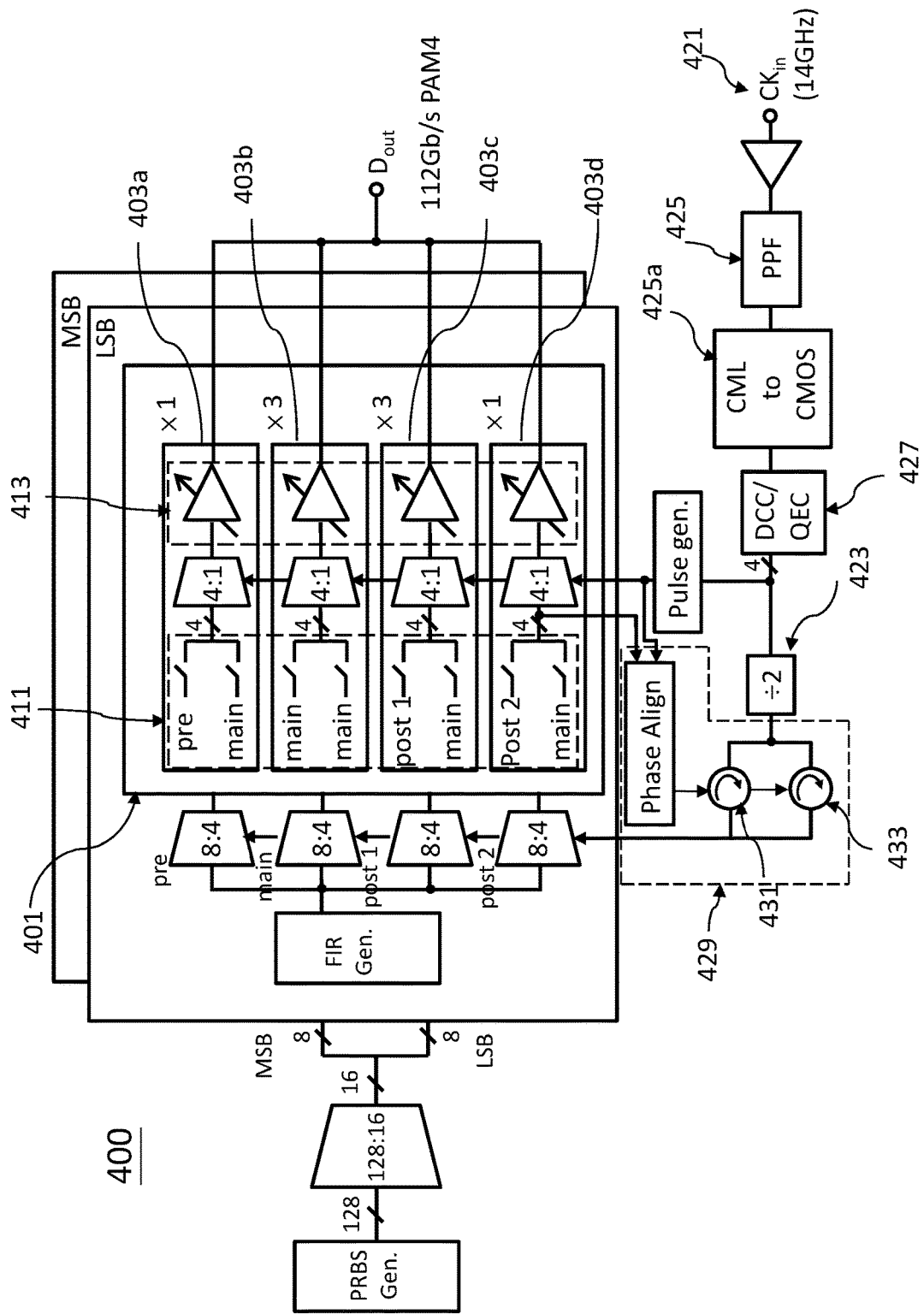
FIG. 4 illustrates the architecture of the implementation of the proposed transmitter according to one embodiment of the present invention.

Proposed TX Architecture:

FIG. 4 illustrates the architecture of the implementation of the proposed 112 Gb/s PAM4 TX 400, where PAM4 represents 4-level pulsed amplitude modulation. The transmitter 400 consists of a 128:1 serializer followed by a two-step feed-forward equalizer. The final stage in the serializer is a 4:1 MUX that includes pulse generation and latching functionality. The pseudo-random bit sequence (PRBS) generator sends 128 bits parallel data through a 128:16 multiplexer (MUX). The data is split into two 8-bit bundles (MSB and LSB) and fed into a FIR block to generate the pre-, main-, post1- and post2-cursor data streams through four 8:4 MUX, respectively. These pre-, main-, post1- and post2-cursor data streams are fed into an output stage 401 and are reconfigured into (pre-, main-), (main-, main-), (post1-, main-), and (post2-, main-) to form coarse FFE 411 then multiplexed by the 4:1 MUX into a fine FFE 413. An output stage 401 illustrates the output segments 403a, 403b, 403c and 403d, each output segment having a coarse 411 (for example, pre- or main-cursor in output segment 403a) and a fine FFE 413. The coarse FFE 411 and the fine FFE 413 are coupled through the 4:1 MUX to form a two-step FFE.

The required sampling clock signals are generated from a phase-locked loop. A quadrature phase generator 421 generates four phases at 14 GHz that directly drive the final 4:1 MUX and the frequency divider 423. The transmitter incorporates a quarter rate clocking (14 GHz), a poly-phase filter 425, a CML to CMOS converter 425a, a duty-cycle and quadrature error correction (DCC/QEC) circuit 427 with statistical phase error detection, and a phase aligned unit 429 to produce re-timed signals at various stages of the data path.

The frequency divider 423 generates four phases 7 GHz in two low-power phase interpolators 431 and 433. A phase aligned unit 429 can be constructed by adding two low-power phase interpolators 431 and 433 as a calibration loop to select the good timing. The details will discuss later.

Figures 5A, 5B:
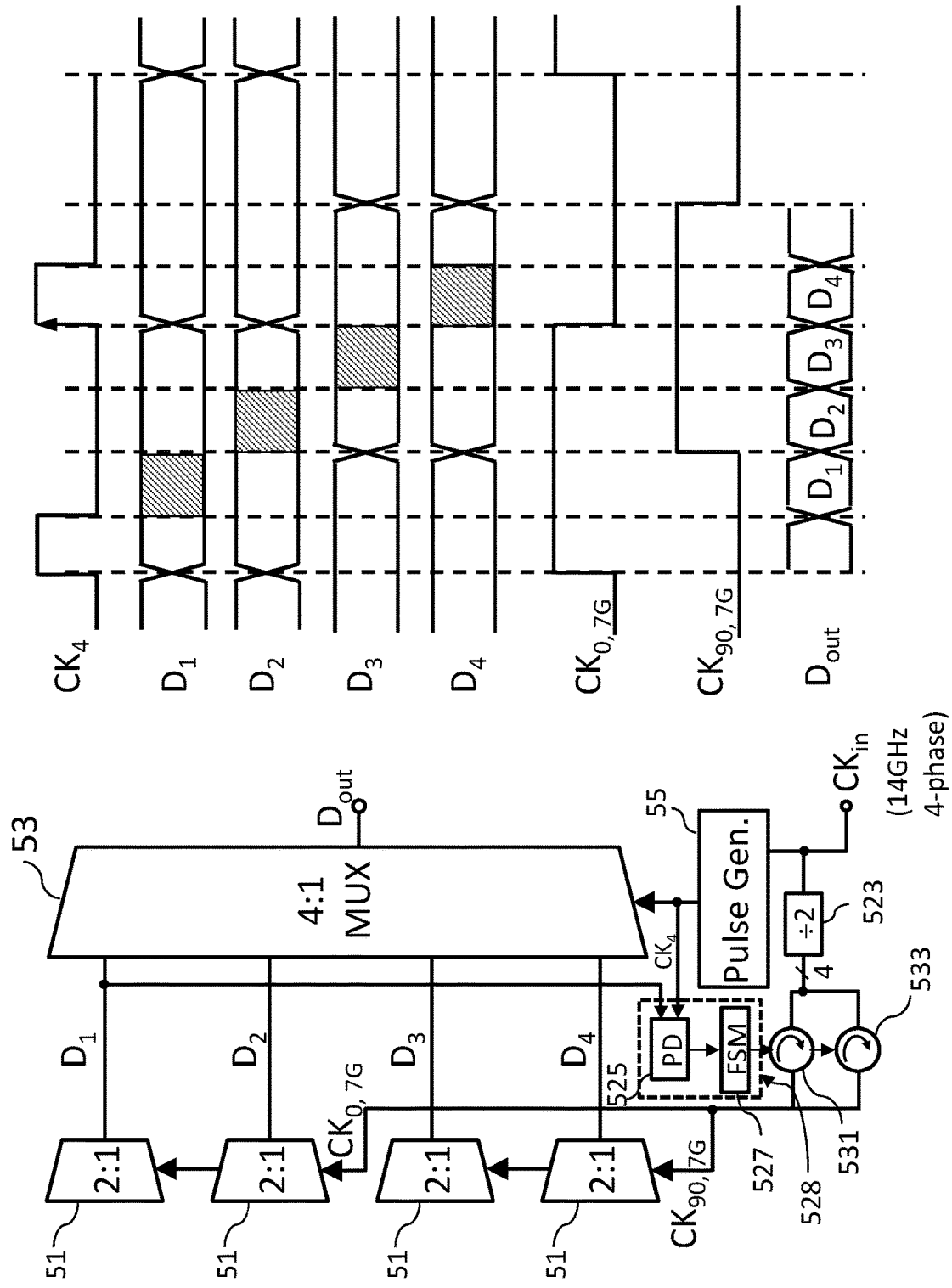
FIG. 5A illustrates multiphase sampling for a CMOS 4:1 MUX according to one embodiment of the present invention.
FIG. 5B illustrates an exemplary timing diagram showing the operation of FIG. 5A, according to one embodiment of the present invention.

To improve power efficiency and robustness, the (14 GHz) retiming latches 201 shown in FIG. 2 are removed. FIG. 5A illustrates a multiphase sampling of the multiphase serialization system (similar to the system described in FIG. 1 and FIG. 2), by adding two low-power phase interpolators 531 and 533, no high-speed latches are needed. In this case, outputs of the four sub-stages 51 of the preceding 8:4 stage directly coupled to the 4:1 MUX 53. Signals $D_1$, $D_2$, $D_3$ and $D_4$ represents digital input signals from the output of the individual sub-stage 51 of the preceding 8:4 stage respectively, while signals $CK_{0,\,7G}$ and $CK_{90,\,7G}$ represents clock signals generated from the two low-power phase interpolators 531 and 533 accordingly.

Phase interpolators are used in many applications including high-speed transceivers to generate interpolated signals from input clock signals. Phase interpolator can also called phase rotator, which has the ability to adjust phase of the input clock signals. Individual phase interpolator requires four phases to form in-phase and quadrature clock signals, i.e. I clock signal and Q clock signal, respectively. The four-phase input clock signals $CK_{in}$ (14 GHz) are processed by a frequency divider 523 to generate two four-phase clock signals for the two phase interpolators 531 and 533, respectively.

In one preferred embodiment of the present invention, the individual clock signal, i.e. I's and Q's clock signal, generated by the two low-power phase interpolators (PIs) 531 and 533 can output a new in-phase clock signal $CK_{0,\,7G}$ and a new quadrature clock signal $CK_{90,\,7G}$. The phases of $D_1$ and $D_2$ are aligned by the output clock signal $CK_{0,\,7G}$, while the phases of $D_3$ and $D_4$ are aligned by the output clock signal $CK_{90,\,7G}$. The relative phase between $D_1$-$D_2$ and $D_3$-$D_4$ is fixed at 90 degree. Therefore the two phase interpolators 531 and 533 can be utilized to construct a calibration loop to select good timing for performing phase alignment. In operation, rising edge of clock signal $CK_4$, one of the 25% duty cycle clock signals $CK_{in}$ generated from the pulse generator 55, aligns with $D_1$. A phase aligner 528 consists of a phase detector (PD) 525 and a finite-state machine 527, the phase detector (PD) 525 detects the phases of data signal $D_1$ and clock signal $Ck_4$, the finite-state machine 527 is utilized to calibrate the alignment by locking the PI's down or up with the clock signal $CK_4$.

FIG. 5B illustrates an exemplary timing diagram showing the operation of the phase alignment of the high-speed CMOS 4:1 MUX using two phase interpolators according to one embodiment of the present invention. There is a 90-degree phase between $D_1$-$D_2$ and $D_3$-$D_4$. This phase difference is introduced by using different clock phases generated by the two phase interpolators 531 and 533 for the multiplexers 51 in the preceding 8:4 stage. This is done by retiming two of the multiplexers 51 in the preceding 8:4 stage. Since the rising edge of clock signal $CK_4$ is set to align with $D_1$, the parallel quarter rate input data streams are processed by the two phase interpolators 531 and 533 to generate the unit interval-(UI) spaced data streams of $D_1$, $D_2$, $D_3$ and $D_4$, respectively. These prepared UI-spaced data are then sequentially selected by the 25% duty cycle clock signals of $CK_1$, $CK_2$, $CK_3$ and $CK_4$ that fed into the 4:1 MUX 53 and to the pulse generator 55 to form the serial sequence. The shaded areas represents the serial sequence of the output data at terminal Dom.

FIG. 5C illustrates the alignment calibration by the finite-state machine, the states of the clock signal $CK_4$ is checked at the rising edge of data stream $D_1$. If the value of $CK_4$ is high ($CK_4=1$), this means that $D_1$ is late (the phase of $D_1$ is lagging) compared with $CK_4$, then the PI phase code of the phase interpolator 531 is set to be +1 making $D_1$ to catch up with $CK_4$. If the value of $CK_4$ is low ($CK_4=0$), this means that $D_1$ is early (the phase of $D_1$ is leading) compared with $CK_4$, then the PI phase code of the phase interpolator 531 is set to be −1 letting $CK_4$ to catch up with $D_1$. Since the relative phase between phase interpolators 531 and 533 is fixed, the PI phase code can be chosen either from the phase interpolator 531 or the phase interpolator 533.

In one of the preferred embodiment, as illustrates in FIG. 5D-E, the alignment calibration can be performed by utilizing a D-type flip flop to check the states of clock signal $CK_4$ at the rising edge of the data stream $D_1$, if the value of $CK_4$ is high ($CK_4=1$, indicated by "A") at the rising edge of $D_1$, i.e. the data stream indicated by real-line, then the PI phase code of the phase interpolator 531 is set to be +1 (up) making $D_1$ to catch up with $CK_4$; if the value of $CK_4$ is low ($CK_4=0$, indicated by "B") at the rising edge of $D_1$, i.e. the data stream $D_1$ indicated by dotted-line, then the PI phase code of the phase interpolator 531 is set to be −1 (down) letting $CK_4$ to catch up with $D_1$.

Traditional CMOS 4:1 MUX for voltage mode driver as shown in FIG. 3A, and FIG. 3B, their implementation includes either having an inverter in series with two transmission gates or stacked devices with a plurality of PMOS switches and NMOS switches connected to form pull-up/pull-down cells to pass data streams and clock signals. Both MUX implementations for 4:1 MUX core that mentioned in FIG. 3A-B can have increased RC constant due to the large number of transistors, which will greatly affect the speed of data transmission.

Figure 6:
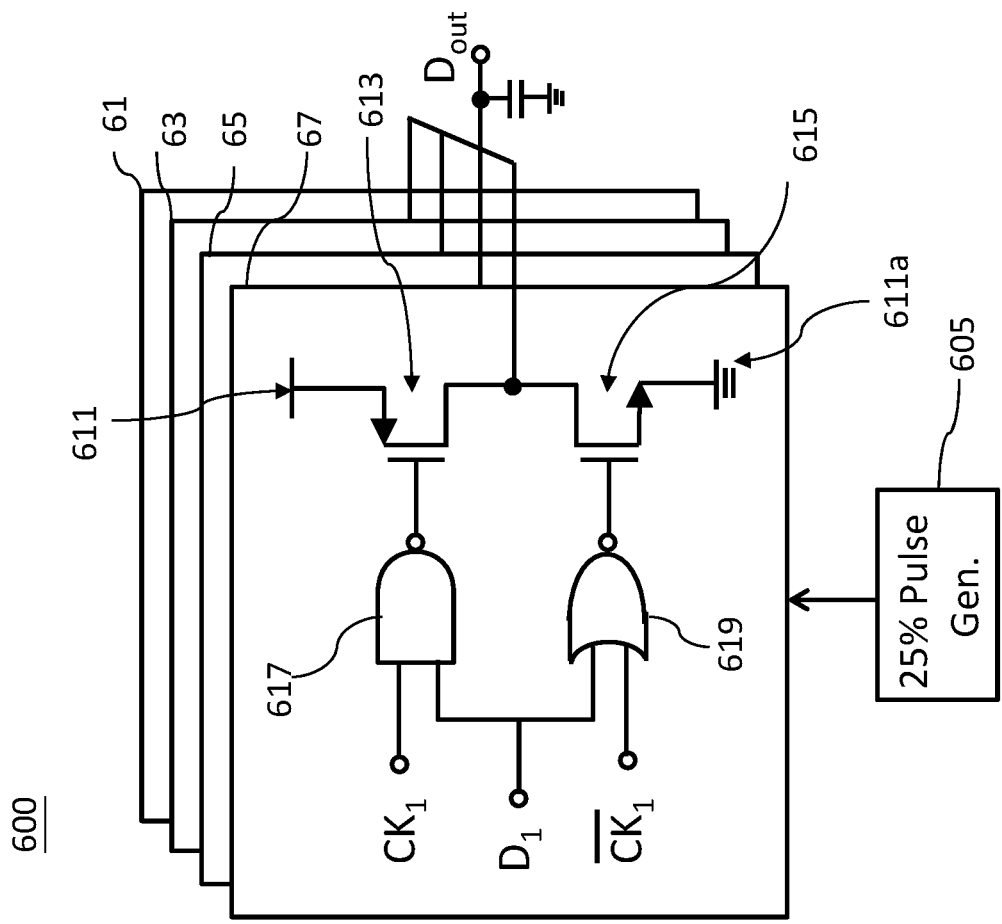
FIG. 6 illustrates a high-speed 4:1 MUX for a voltage-mode transmitter according to one embodiment of the present invention.

Voltage-mode driver needs rail-to-rail input swing to maintain the output impedance and swing, as a result, high-speed CMOS 4:1 MUXs are required. Please refers to FIG. 6, a high-speed 4:1 MUX 600 for voltage-mode driver in the transmitter is proposed. Each segment 61, 63, 65 or 67 represents driver slice for one clock path generated by the 25% pulse generator 605, which can be designed using a P-over-N voltage driver including a first supply source 611, a PMOS transistor 613 and a NMOS transistor 615, and a second supply source 611a serially connected to form a current path, a NAND 617 and a NOR gate 619 respectively coupled to the gate of the PMOS and the NMOS transistors for clock signals ($CK_1$ and $\overline{CK}_1$) and data stream $D_1$ input. In this 4:1 MUX implementation, in each segment (or slice) the data or clock path has only one transistor (its ON-state acted like a resistor) involved, which can greatly reduce the power consumption during high-speed operation and can increase the bandwidth of data communication.

As will be understood by persons skilled in the art, the foregoing preferred embodiment of the present invention illustrates the present invention rather than limiting the present invention. Having described the invention in connection with a preferred embodiment, modifications will be suggested to those skilled in the art. Thus, the invention is not to be limited to this embodiment, but rather the invention is intended to cover various modifications and similar arrangements included within the spirit and scope of the appended claims, the scope of which should be accorded the broadest interpretation, thereby encompassing all such modifications and similar structures. While the preferred embodiment of the invention has been illustrated and described, it will be appreciated that various changes can be made without departing from the spirit and scope of the invention.

What is claimed is:

1. A multiphase serialization system for a voltage-mode transmitter comprising:
    a N-to-one stage driven by a N-phase input clock signals, N being a positive even number;
    a phase alignment unit driven by the N-phase input clock signals being configured to generate interpolated sampling clock signals by adjusting a plurality of reference clock signals provided to the phase alignment unit based on the N-phase input clock signals; and
    a preceding multiplexing stage driven by the interpolated sampling clock signals configured to receive incoming data streams and to output phase-aligned data streams to the N-to-one stage, wherein the output phase-aligned data streams are aligned with a rising edge of one of the N-phase input clock signals.

2. The system of claim 1, wherein the preceding multiplexing stage is composed of a plurality of sub-preceding multiplexing stages, each sub-preceding multiplexing stage being driven by the interpolated sampling clock signals is configured to receive the incoming data streams and to output the phase aligned data streams to the N-to-one stage.

3. The system of claim 2, wherein the phase alignment unit includes:
    a first phase interpolator; and
    a second phase interpolator coupled to the first phase interpolator,
    wherein the first phase interpolator is configured to receive the reference clock signals from the N-phase input clock signals to generate a first interpolated clock signal for driving a portion of the sub-preceding multiplexing stages, and
    wherein the second phase interpolator is configured to receive the reference clock signals from the N-phase input clock signals to generate a second interpolated clock signal for driving the remaining portion of the sub-preceding multiplexing stages.

4. The system of claim 3, wherein the first interpolated clock signal is a zero-degree clock signal.

5. The system of claim 3, wherein the second interpolated clock signal is a 90-degree clock signal.

6. The system of claim 1, wherein the alignment of the output phase-aligned data streams is calibrated by checking the states of the one of the N-phase input clock signals at the rising edge of one of the output phase-aligned data streams, if the one of the N-phase input clock signals is high, the phase alignment unit advances the phase of the output phase-aligned data streams letting the phase of the output phase-aligned data streams to catch up the phase of the N-phase input clock signals; if the one of the N-phase input clock signal is low, the phase alignment unit delays the phase of the output phase-aligned data streams letting the phase of the N-phase input clock signals to catch up the phase of the output phase-aligned data streams.

7. The system of claim 1, wherein the N-to-one stage having N slices, each slice comprises:
    a first supply source, a first transistor, a second transistor, and a second supply source serially connected to provide a current path;
    a NAND gate coupled to a gate of the first transistor; and
    a NOR gate coupled to a gate of the second transistor, wherein input terminals of the NAND gate or the NOR gate are used for either inputting the phase-aligned data streams or the N-phase input clock signals.

8. The system of claim 7, wherein the first transistor is a p-type metal-oxide-semiconductor (PMOS) field effect transistor.

9. The system of claim 7, wherein the second transistor is a n-type metal-oxide-semiconductor (NMOS) field effect transistor.

10. The system of claim 7, wherein the second supply source is set to be a ground source.

11. A method of multiphase serialization for a voltage-mode transmitter comprising:
    providing a N-to-one stage driven by N-phase input clock signals, N being a positive even number;

providing a phase alignment unit driven by the N-phase input clock signals for generating interpolated sampling clock signals by adjusting a plurality of reference clock signals provided to the phase alignment unit based on the N-phase input clock signals; and providing a preceding multiplexing stage driven by the interpolated sampling clock signals for receiving incoming data streams and outputting phase aligned data streams to the N-to-one stage, wherein the output phase-aligned data streams are aligned with a rising edge of one of the N-phase input clock signals.

12. The method of claim 11, wherein the preceding multiplexing stage is composed of a plurality of sub-preceding multiplexing stages, each sub-preceding multiplexing stage being driven by the interpolated sampling clock signals is configured to receive the incoming data streams and to output the phase aligned data streams to the N-to-one stage.

13. The method of claim 12, wherein the phase alignment unit includes:
   a first phase interpolator; and
   a second phase interpolator coupled to the first phase interpolator,
   wherein the first phase interpolator is configured to receive the reference clock signals from the N-phase input clock signals to generate a first interpolated clock signal for driving a portion of the sub-preceding multiplexing stages, and
   wherein the second phase interpolator is configured to receive the reference clock signals from the N-phase input clock signals to generate a second interpolated clock signals for driving the remaining portion of the sub-preceding multiplexing stages.

14. The method of claim 13, wherein the first interpolated clock signal is a zero-degree clock signal.

15. The method of claim 13, wherein the second interpolated clock signal is a 90-degree clock signal.

16. The method of claim 11, wherein the alignment of the output phase-aligned data streams is calibrated by checking the states of the one of the N-phase input clock signals at the rising edge of one of the output phase-aligned data streams, if the one of the N-phase input clock signals is high, the phase alignment unit advances the phase of the output phase-aligned data streams letting the phase of the output phase-aligned data streams to catch up the phase of the N-phase input clock signals; if the one of the N-phase input clock signals is low, the phase alignment unit delays the phase of the output phase-aligned data streams letting the phase of the N-phase input clock signals to catch up the phase of the output phase-aligned data streams.

17. The method of claim 11, wherein the N-to-one stage having N slices, each slice comprises:
   a first supply source, a first transistor, a second transistor, and a second supply source serially connected to provide a current path;
   a NAND gate coupled to a gate of the first transistor; and
   a NOR gate coupled to a gate of the second transistor,
   wherein input terminals of the NAND gate or the NOR gate are used for either inputting the phase-aligned data streams or the N-phase input clock signals.

18. The method of claim 17, wherein the first transistor is a p-type metal-oxide-semiconductor (PMOS) field effect transistor.

19. The method of claim 17, wherein the second transistor is a n-type metal-oxide-semiconductor (NMOS) field effect transistor.

20. The method of claim 17, wherein the second supply source is set to be a ground source.

* * * * *